(12) United States Patent
Cha et al.

(10) Patent No.: US 8,156,650 B2
(45) Date of Patent: Apr. 17, 2012

(54) METHOD OF MANUFACTURING A NOZZLE PLATE

(75) Inventors: Tae-woon Cha, Seoul (KR); Wou-sik Kim, Seoul (KR); Seong-jin Kim, Seong-nam si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1211 days.

(21) Appl. No.: 11/877,156

(22) Filed: Oct. 23, 2007

(65) Prior Publication Data

US 2008/0261129 A1    Oct. 23, 2008

(30) Foreign Application Priority Data

Apr. 23, 2007 (KR) ................. 10-2007-0039441

(51) Int. Cl.
*B21D 53/76* (2006.01)
(52) U.S. Cl. .................. 29/890.1; 347/45; 347/47
(58) Field of Classification Search ............ 29/890.1; 347/45, 47; 427/147
See application file for complete search history.

(56) References Cited

U.S. PATENT DOCUMENTS

| 7,086,142 B2 * | 8/2006 | Kim et al. ............ 29/890.1 X |
| 7,562,964 B2 * | 7/2009 | Furukawa et al. ......... 347/47 X |

FOREIGN PATENT DOCUMENTS

| JP | 05124200 A * | 5/1993 | ........ 29/890.1 X |
| JP | 2002-355957 | 12/2002 | |
| JP | 2006-98760 | 4/2006 | |

\* cited by examiner

*Primary Examiner* — A. Dexter Tugbang
(74) *Attorney, Agent, or Firm* — Stanzione & Kim, LLP

(57) ABSTRACT

A selective surface treatment method using a block copolymer, a black matrix and a method of manufacturing the same, and a nozzle plate and a method of manufacturing the same are provided. According to the method of manufacturing a nozzle plate, a block copolymer layer including an ink-phobic polymer block and an ink-philic polymer block may be formed on a stamp, a substrate having nozzles formed therein and an ink-philic coating film formed on an outer surface of the substrate and inner walls of the nozzles may be prepared, and the block copolymer layer formed on the stamp may be transferred onto an upper surface of the ink-philic coating film formed on the outer surface of the substrate.

7 Claims, 5 Drawing Sheets

METHOD OF MANUFACTURING A NOZZLE PLATE

CROSS-REFERENCE TO RELATED APPLICATIONS

This application claims priority under 35 U.S.C. §119(a) from Korean Patent Application No. 10-2007-0039441, filed on Apr. 23, 2007, in the Korean Intellectual Property Office, the disclosure of which is incorporated herein in its entirety by reference.

BACKGROUND OF THE INVENTION

1. Field of the Invention

The present general inventive concept relates to a selective surface treatment method using a block copolymer, a black matrix and a method of manufacturing the same, and a nozzle plate and a method of manufacturing the same.

2. Description of the Related Art

Liquid crystal display devices include a color filter that allows light modulated by a liquid crystal layer to pass therethrough in order to form an image with a required color. The color filter is manufactured by forming a black matrix on a transparent substrate and filling ink of a predetermined color such as red, green, or blue in all pixels defined by the black matrix. When the black matrix includes both ink-philic upper and side surfaces, ink injected in the pixels may flow over an upper surface of the black matrix, thereby causing ink color mixture. Alternatively, when the black matrix includes both ink-phobic upper and side surfaces, the ink color mixture between the pixels can be prevented. However, the side surfaces of the black matrix do not have sufficient wetting for ink, and ink cannot be applied to a uniform thickness in each pixel.

Therefore, in order to form ink to a uniform thickness in the pixels and also prevent the ink color mixture between the pixels, the black matrix may include an ink-phobic upper surface and an ink-philic side surface. As one surface treatment method for this purpose, an ink-phobic coating film may be selectively formed on only an upper surface of an ink-philic black matrix. However, if the ink-phobic coating film is formed too thick, development thereof is difficult. Also, if the ink-phobic coating film is formed too thin, the ink-phobic coating film may be easily separated from the black matrix due to weak adhesion therebetween. This is because the black matrix and the ink-phobic coating film are formed of materials with properties different from each other. Therefore, an ink-phobic material having very good adhesion with the ink-philic black matrix is required.

Inkjet heads are devices used to form color images on printing mediums by discharging ink droplets onto a desired region of a printing medium through nozzles of a nozzle plate. Inkjet heads can be classified into two types depending on the ink ejecting mechanism: thermal inkjet heads and piezoelectric inkjet heads. The thermal inkjet head ejects ink based on an expansion of the bubbles generated by heat, and the piezoelectric inkjet head ejects ink using a pressure generated by a deformation of a piezoelectric material.

In the inkjet head, a surface treatment of the nozzle plate directly affects the ink ejection performance, for example, directivity and ejection speed of ink droplets ejected through nozzles, or the like. That is, in order to improve the ink ejection performance, inner walls of the nozzles should be ink-philic, and a surface of the nozzle plate outside the nozzles should be ink-phobic. In detail, when the nozzles have ink-philic inner walls, a contact angle for ink decreases and a capillary force increases, and thus the refill time of ink can be reduced, thereby increasing the ejection frequency of the nozzles. Also, when the nozzle plate outside the nozzles has an ink-phobic surface, ink wetting can be prevented on the surface of the nozzle plate to improve the directivity of ink. Accordingly, the nozzle plate may include an ink-philic surface and an ink-phobic coating film may be selectively formed on only a surface of the nozzle plate outside the nozzles. Here, the ink-phobic coating film should have a constant contact angle for ink even after a sequence of maintenance processes of the inkjet head. In detail, the ink-phobic coating film should have excellent adhesion with the surface of the nozzle plate in order to improve the durability thereof. For this purpose, an ink-phobic material having very good adhesion with the ink-philic surface of the nozzle plate is required.

SUMMARY OF THE INVENTION

The present general inventive concept provides a surface treatment method of selectively forming a coating film with improved durability using a block copolymer.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a selective surface treatment method for a substrate, the method including forming a block copolymer layer including a hydrophilic polymer block and a hydrophobic polymer block on a predetermined surface of the substrate.

The substrate may include a hydrophilic surface, and the block copolymer layer includes a hydrophilic polymer block formed on the surface of the substrate and a hydrophobic polymer block formed on the hydrophilic polymer block.

The substrate may include a hydrophobic surface, and the block copolymer layer includes a hydrophobic polymer block formed on the surface of the substrate and a hydrophilic polymer block formed on the hydrophobic polymer block.

The foregoing and/or other aspects and utilities of the general inventive concept may also be achieved by providing a black matrix usable with a color filter, the black matrix including a light-shielding layer formed of an ink-philic material on a transparent substrate and a block copolymer layer formed on the light-shielding layer and including an ink-philic polymer block and an ink-phobic polymer block.

The block copolymer layer may include an ink-philic polymer block formed on upper surface of the light-shielding layer and an ink-phobic polymer block formed on upper surface of the ink-philic polymer block.

The foregoing and/or other aspects and utilities of the general inventive concept may also be achieved by providing a method of manufacturing a black matrix usable with a color filter, the method including forming a light-shielding layer formed of an ink-philic material on a transparent substrate, forming a block copolymer layer including an ink-philic polymer block and an ink-phobic polymer block on the light-shielding layer, and patterning the light-shielding layer and the block copolymer layer.

When the light-shielding layer is formed of a photosensitive material, and the light-shielding layer and the block copolymer layer may be patterned by exposing and developing the light-shielding layer in a predetermined shape.

When the light-shielding layer is formed of a non photosensitive material, the patterning of the light-shielding layer and the block copolymer layer may include applying a photoresist on the light-shielding layer, patterning the photoresist in a predetermined shape and etching the block copolymer layer and the light-shielding layer using the patterned photoresist as an etch mask.

The foregoing and/or other aspects and utilities of the general inventive concept may also be achieved by providing a nozzle plate usable with an inkjet head, the nozzle plate including a substrate in which nozzles are formed, an ink-philic coating film formed on an outer surface of the substrate and inner walls of the nozzles, and a block copolymer layer formed on the ink-philic coating film formed on the outer surface of the substrate and including an ink-philic polymer block and an ink-phobic polymer block.

The substrate may be formed of silicon and the ink-philic coating film may be formed of oxidized silicon.

The block copolymer layer may include an ink-philic polymer block formed on upper surface of the ink-philic coating film and an ink-phobic polymer block formed on upper surface of the ink-philic polymer block.

The foregoing and/or other aspects and utilities of the general inventive concept may also be achieved by providing a method of manufacturing a nozzle plate usable with an inkjet head, the method including preparing a stamp, forming a block copolymer layer including an ink-phobic polymer block and an ink-philic polymer block on the stamp, preparing a substrate with nozzles formed therein and an ink-philic coating film formed on its outer surface and inner walls of the nozzles and transferring the block copolymer layer formed on the stamp onto an upper surface of the ink-philic coating film formed on the outer surface of the substrate.

The stamp may be formed of an ink-phobic material.

The block copolymer layer may include an ink-phobic polymer block formed on upper surface of the stamp and an ink-philic polymer block formed on upper surface of the in-phobic polymer block. In addition, the transferred block copolymer layer may include the ink-philic polymer block formed on upper surface of the ink-philic coating film formed on the outer surface of the substrate and the ink-phobic polymer block formed on upper surface of the ink-philic polymer block.

The foregoing and/or other aspects and utilities of the general inventive concept may also be achieved by providing a black matrix usable with a color filter, the black matrix including a substrate having a first hydrophilic portion, a light-shielding layer having a second hydrophilic portion disposed on the first hydrophilic portion of the substrate and a block copolymer layer having a hydrophilic layer and a hydrophobic layer, wherein the hydrophilic layer of the block copolymer layer is interposed between the second hydrophilic portion of the light-shielding layer and the hydrophobic layer.

The foregoing and/or other aspects and utilities of the general inventive concept may also be achieved by providing a black matrix usable with a color filter, the black matrix including a substrate having a first hydrophobic portion, a light-shielding layer having a second hydrophobic portion disposed on the first hydrophobic portion of the substrate, and a block copolymer layer having a hydrophobic layer and a hydrophilic layer, wherein the hydrophobic layer of the block copolymer layer is interposed between the second hydrophobic layer of the light-shielding layer and the hydrophilic layer.

The foregoing and/or other aspects and utilities of the general inventive concept may also be achieved by providing an inkjet head including an ink chamber to store ink, and a nozzle plate disposed proximate to the ink chamber, the nozzle plate includes a substrate having a plurality of nozzles, an ink-philic coating film formed on an outer surface of the substrate and inner walls of the plurality of nozzles and a block copolymer layer formed on the ink-philic coating film formed on the outer surface of the substrate and including an ink-philic polymer block and an ink-phobic polymer block.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
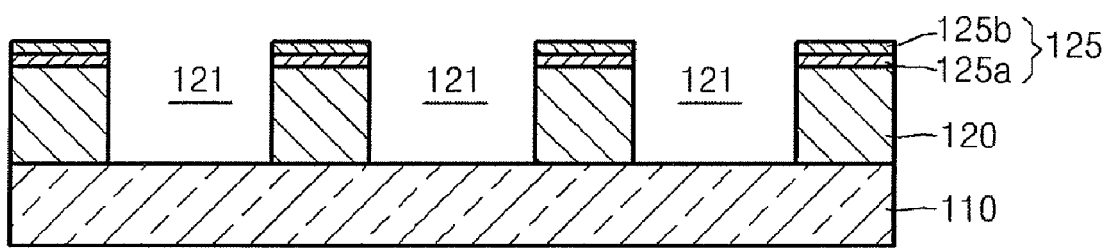
FIG. 1 is a sectional view illustrating a black matrix according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

In an embodiment of the present general inventive concept, a block copolymer can be used to selectively form a durable coating film on a surface of a predetermined structure. For example, a block copolymer layer is formed on a predetermined surface of a substrate, in order to selectively form a hydrophobic coating film with durability on a surface of a hydrophilic substrate or selectively form a hydrophilic coating film with durability on a surface of a hydrophobic substrate.

The block copolymer includes two types of polymers alternately coupled to each other in a block shape. When the two types of polymer blocks have similar lengths, the block copolymer has a lamellar structure in which the two types of polymer blocks are alternately stacked. Here, if the thickness of the block copolymer is controlled, a lamellar structure in which each of the two types of polymer blocks is formed in a single layer can be obtained.

In an embodiment of the present general inventive concept, a surface of a substrate is selectively treated using a block copolymer including one layer of a hydrophilic polymer block formed of polymerized hydrophilic monomers and one layer of a hydrophobic polymer block formed of polymerized hydrophobic monomers. For example, a hydrophobic coating film with a durability property can be formed by forming the block copolymer layer on a predetermined surface of a hydrophilic substrate. Here, the block copolymer includes a hydrophilic polymer block formed on a surface of the hydrophilic substrate and a hydrophobic polymer block formed on a surface of the hydrophilic polymer block. Since both the hydrophilic substrate and the hydrophilic polymer block are formed of a hydrophilic material, the hydrophilic polymer block can be securely attached to a surface of the hydrophilic substrate because of excellent adhesion therebetween. Therefore, the exposed hydrophobic polymer block forms a hydrophobic coating film with a durability property. In an embodiment of the present general inventive concept, the substrate is hydrophilic, but the present general inventive concept can be applied to a hydrophobic substrate. Accordingly, a block copolymer layer includes a hydrophobic polymer block that forms on a surface of a hydrophobic substrate and a hydrophilic polymer block that forms on a surface of the hydrophobic polymer block.

Hereinafter, various embodiments of the present general inventive concept will be described based on the above-mentioned block copolymer. FIG. 1 is a sectional view illustrating a black matrix for a color filter according to an embodiment of the present general inventive concept.

Referring to FIG. 1, a black matrix is formed on a transparent substrate 110. A plurality of pixels 121 are defined by the black matrix on the transparent substrate 110. The transparent substrate 110 may be formed of an ink-philic material. The transparent substrate 110 may be a glass substrate, but is not limited thereto. Since commonly used ink is aqueous, in this case, 'ink-philic' means 'hydrophilic'. However, ink may be non-aqueous, in this case, 'ink-philic' may mean 'hydrophobic'.

The black matrix includes a light-shielding layer 120 formed in a predetermined shape on the transparent substrate 110 and a block copolymer layer 125 formed on the light-shielding layer 120. The light-shielding layer 120 may be formed of an ink-philic material being black in color. For example, the light-shielding layer 120 may be formed of an organic polymer resin such as polyimide or the like, but is not limited thereto.

The block copolymer layer 125 includes a hydrophilic polymer block 125a formed of polymerised ink-philic monomers and a hydrophobic polymer block 125b formed of polymerised ink-phobic monomers. As described above, the block copolymer layer 125 has a lamellar structure including one layer of the ink-philic polymer block 125a and one layer of the ink-phobic polymer block 125b. As such, in an embodiment of the present embodiment, the block copolymer layer 125 includes the ink-philic polymer block 125a formed on an upper surface of the light-shielding layer 120 and the ink-phobic polymer block 125b formed on an upper surface of the ink-philic polymer block 125a.

Therefore, the ink-philic polymer block 125a can be securely attached to an upper surface of the light-shielding layer 120, because they have a same property, that is, the ink-philic property, and thus adhesion therebetween is very good. As a result, the exposed ink-phobic polymer block 125b can form an ink-phobic coating film with improved durability. As such, since the black matrix has ink-philic side surfaces and an ink-phobic upper surface, ink color mixtures can be prevented between the pixels 121 and ink layers filled in the pixels 121 can be formed to a uniform thickness.

Hereinafter, a method of manufacturing the black matrix illustrated in FIG. 1 will be described with reference to FIGS. 2 through 5, and FIG. 11 according to an embodiment of the present general inventive concept.

Figure 2:
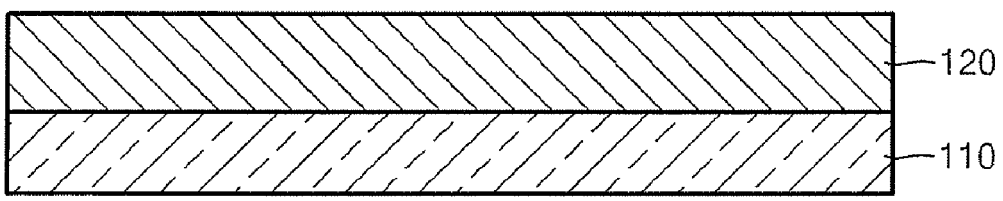
FIGS. 2 through 5 are views illustrating a method of manufacturing the black matrix illustrated in FIG. 1, according to an embodiment of the present general inventive concept.

Referring to FIG. 2, a transparent substrate 110 is prepared. The transparent substrate 110 may be formed of an ink-philic material. For example, the transparent substrate 110 may be a glass substrate, but is not limited thereto. Next, a light-shielding layer 120 is formed to a predetermined thickness on the transparent substrate 110. The light-shielding layer 120 may be formed by applying an ink-philic material being black in color to a predetermined thickness on the transparent substrate 110 using, for example, spin coating, die coating, or dip coating. The light-shielding layer 120 may be formed of an organic polymer resin. In detail, the light-shielding layer 120 may be formed of polyimide, photosensitive polyimide, or the like, but is not limited thereto.

Figure 3:
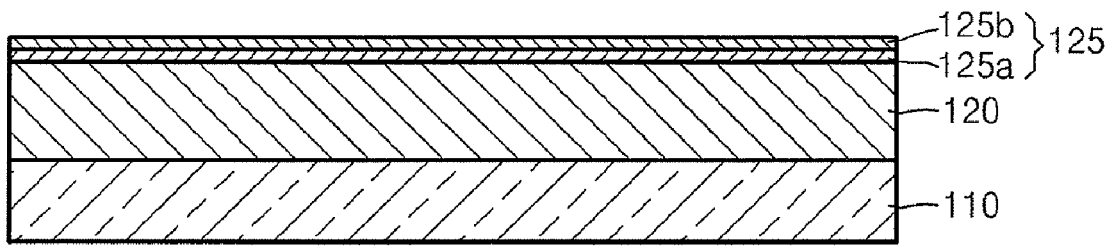
Figure 4:
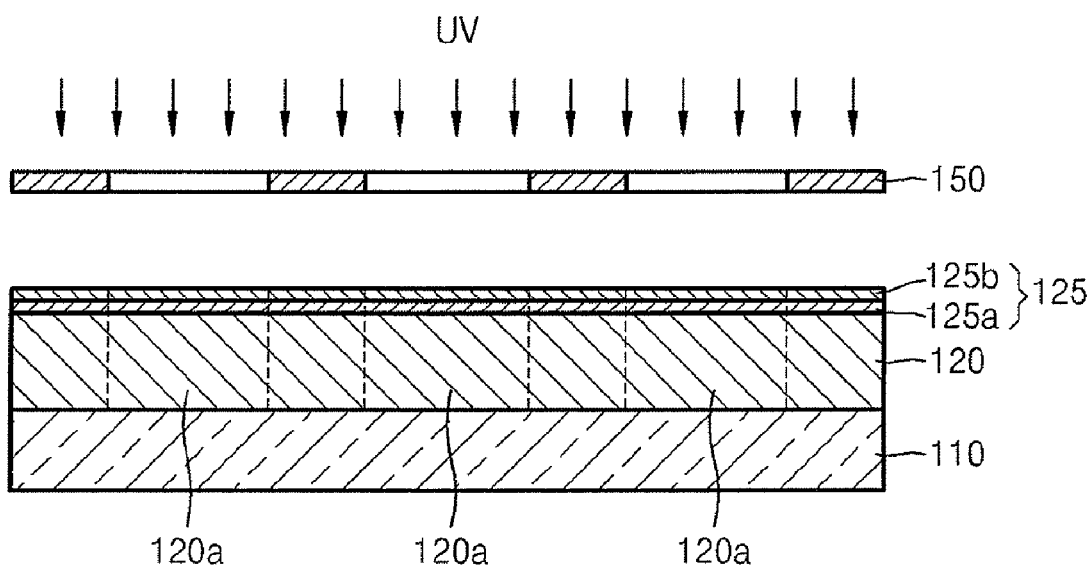

Referring to FIG. 3, a block copolymer layer 125 is formed on the light-shielding layer 120. The block copolymer layer 125 may be formed by applying a block copolymer including an ink-philic polymer block 125a and an ink-phobic polymer block 125b to a predetermined thickness on the light-shielding layer 120 using, for example, spin coating. Here, the block copolymer layer 125 has a lamellar structure, and the block copolymer layer 125 of the lamellar structure including one layer of the ink-philic polymer block 125a and one layer of the ink-phobic polymer block 125b can be formed by adjusting a thickness of the block copolymer layer 125 applied to an upper surface of the light-shielding layer 120. As such, the block copolymer layer 125 includes the ink-philic polymer block 125a formed on upper surface of the light-shielding layer 120 and the ink-phobic polymer block 125b formed on upper surface of the ink-philic polymer block 125a.

Therefore, the ink-philic polymer block 125a can be securely attached to the upper surface of the light-shielding layer 120, because they have the same property, that is, the ink-philic property, and thus adhesion is excellent therebetween. The ink-phobic polymer block 125b of the block copolymer layer 125 is exposed to the outside.

Next, the light-shielding layer 120 and the block copolymer layer 125 are patterned in a predetermined shape to form a black matrix that defines a plurality of pixels 121 (FIG. 1) on the transparent substrate 110. The light-shielding layer 120 and the block copolymer layer 125 may be patterned using the following process.

Figure 5:
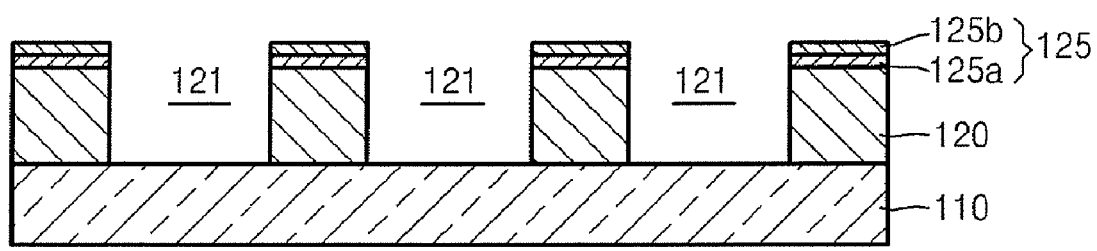

When the light-shielding layer 120 is formed of a photosensitive material, for example, photosensitive polyimide, it may be exposed and developed in a predetermined shape using a photolithography process to pattern the light-shielding layer 120 and the block copolymer layer 125. In detail, referring to FIG. 4, a photo mask 150 is prepared over the block copolymer layer 125, and then ultraviolet light is irradiated through the photo mask 150 to expose the light-shielding layer 120 in a predetermined shape. Next, exposed portions of the light-shielding layer 120 are removed through development to form the black matrix. In this operation, portions of the block copolymer layer 125 located over the removed portions of the light-shielding layer 120 may be removed by a lift off operation. Here, since the hydrophilic polymer block 125a of the block copolymer layer 125 is securely attached to the upper surface of the light-shielding layer 120, the block copolymer layer 125 is not easily separated from the light-shielding layer 120 even after the development. The black matrix manufactured by the above process is illustrated in FIG. 5. The plurality of pixels 121 are defined by the black matrix on the transparent substrate 110. In the present embodiment, the light-shielding layer 120 is formed of a positive photosensitive material, but the light-shielding layer 120 may be formed of a negative photosensitive material.

When the light-shielding layer 120 is formed of a negative photosensitive material, for example, polyimide, the light-shielding layer 120 and the block copolymer layer 125 are patterned by the following process. A photoresist (not illustrated) is applied on the block copolymer layer 125, and is patterned in a predetermined shape by a photolithography process. The block copolymer layer 125 and the light-shielding layer 120 are sequentially etched using the patterned photoresist as an etch mask until the transparent substrate 110 is exposed. Next, the photoresist is removed to form the black matrix as illustrated in FIG. 5.

Figure 11:
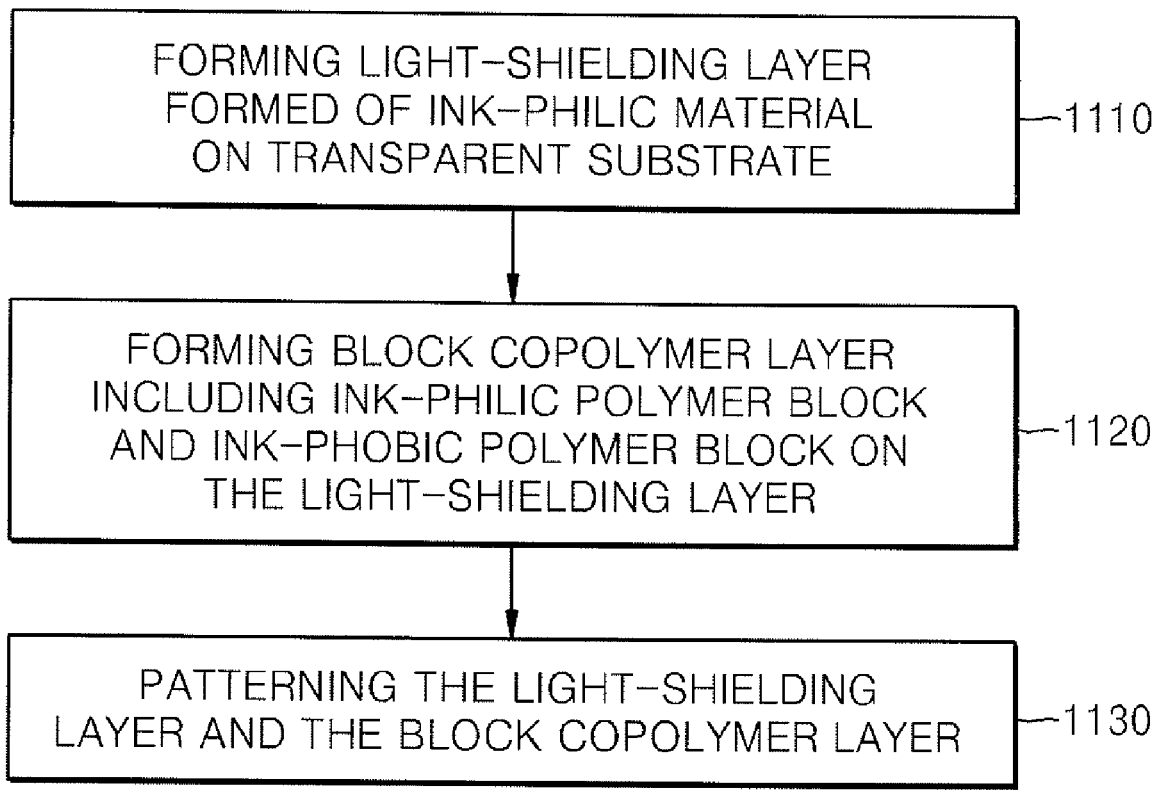
FIG. 11 is a flowchart illustrating a method of manufacturing a black matrix usable with a color filter according to an exemplary embodiment of the present general inventive concept.

FIG. 11 is a flowchart illustrating a method of manufacturing a black matrix usable with a color filter according to an exemplary embodiment of the present general inventive concept. Referring to FIG. 11, in operation 1110, a light-shielding layer formed of ink-philic material is formed on a transparent substrate. In operation 1120, a block copolymer layer including ink-philic polymer block and ink-phobic polymer block is formed on the light-shielding layer. In operation 1130, the light-shielding layer and the block copolymer layer are patterned.

The black matrix described in the present embodiment can be used for liquid crystal display devices, but the present general inventive concept can be applied to, for example, a bank of an organic light emitting diode (OLED).

Figure 6:
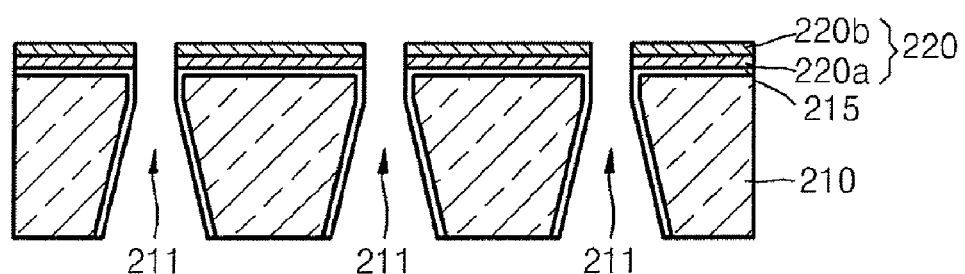
FIG. 6 is a sectional view illustrating a nozzle plate according to another embodiment of the present general inventive concept.

FIG. 6 is a sectional view of a nozzle plate for an inkjet head according to another embodiment of the present general inventive concept.

Referring to FIG. 6, the nozzle plate includes a substrate 210 in which nozzles 211 are formed, an ink-philic coating film 215 formed on a surface of the substrate 210, and a block copolymer layer 220 selectively formed on a surface of the ink-philic coating layer 215.

The nozzles 211 for ejecting ink are formed so as to penetrate the substrate 210. The substrate 210 may be a silicon substrate, but is not limited thereto. The ink-philic coating film 215 is formed on surfaces of the substrate 210, in detail, inner walls of the nozzles 211 and outer surfaces of the substrate 210. The ink-philic coating film 215 may be formed of, for example, oxidized silicon.

The block copolymer layer 220 is formed on the ink-philic coating film 215 formed on an upper surface of the substrate 210, that is, on an outer surface of the substrate 210 at the side of outlets of the nozzles 211. The block copolymer layer 220 includes a hydrophilic polymer block 220a formed of polymerized ink-philic monomers and a hydrophobic polymer block 220b formed of polymerized ink-phobic monomers. Here, the block copolymer layer 220 has a lamellar structure including one layer of the ink-philic polymer block 220a and one layer of the ink-phobic polymer block 220b. As such, in the present embodiment, the block copolymer layer 220 includes the ink-philic polymer block 220a formed on upper surface of the ink-philic coating film 215 and the ink-phobic polymer block 220b formed on upper surface of the ink-philic polymer block 220a.

Therefore, the ink-philic polymer block 220a can be securely attached to an upper surface of the ink-philic coating film 215, because adhesion is very good between the ink-philic coating film 215 and the ink-philic polymer block 220a that have the same property, that is, the ink-philic property. Accordingly, the ink-phobic polymer block 220b exposed outside forms an ink-phobic coating film with durability.

As such, the nozzles 211 have ink-philic inner walls, and the nozzle plate has an ink-phobic surface outside the nozzles 211, and thus an ejection frequency can increase and the directivity of ejected ink droplets can be improved. Also, since the block copolymer layer 220 is securely attached to a surface of the nozzle plate, the durability of the block copolymer layer 220 can be improved. Accordingly, the block copolymer layer 220 is not easily separated from the surface of the nozzle plate even after a sequence of maintenance processes for an inkjet head.

Hereinafter, a method of manufacturing the nozzle plate for an inkjet head illustrated in FIG. 6 will be described with reference to FIGS. 7 through 10, and FIG. 12 according to another embodiment of the present general inventive concept.

Figure 7:
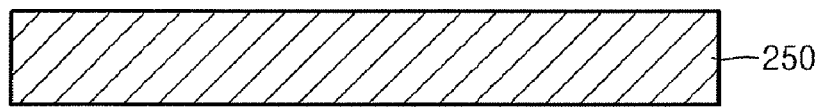
FIGS. 7 through 10 are views illustrating a method of manufacturing the nozzle plate illustrated in FIG. 6, according to another embodiment of the present general inventive concept.

Referring to FIG. 7, a stamp 250 is prepared. The stamp 250 may be formed of an ink-phobic material. For example, the stamp 250 may be formed of polydimethylsiloxane (PDMS), but is not limited thereto.

Figure 8:
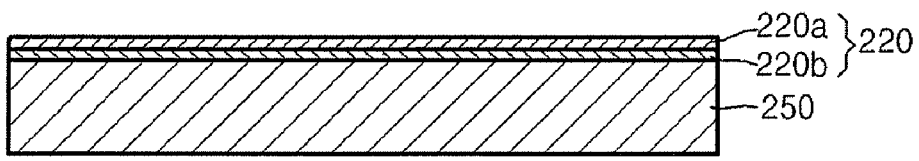

Referring to FIG. 8, a block copolymer layer 220 is formed on the stamp 250. In detail, the block copolymer layer 220 may be formed by applying a block copolymer including an ink-phobic polymer block 220b and an ink-philic polymer block 220 to a predetermined thickness on the stamp 250, for example, using spin coating or dip coating. Here, the block copolymer layer 220 has a lamellar structure, and the block copolymer layer 220 with the lamellar structure including one layer of the ink-phobic polymer block 220b and one layer of the ink-philic polymer block 220a can be formed by adjusting a thickness of the block copolymer layer 220 applied on the stamp 250. As such, the block copolymer layer 220 includes the ink-phobic polymer block 220b formed on upper surface of the stamp 250 and the ink-philic polymer block 220a formed on upper surface of the ink-phobic polymer block 220b.

Figure 9:
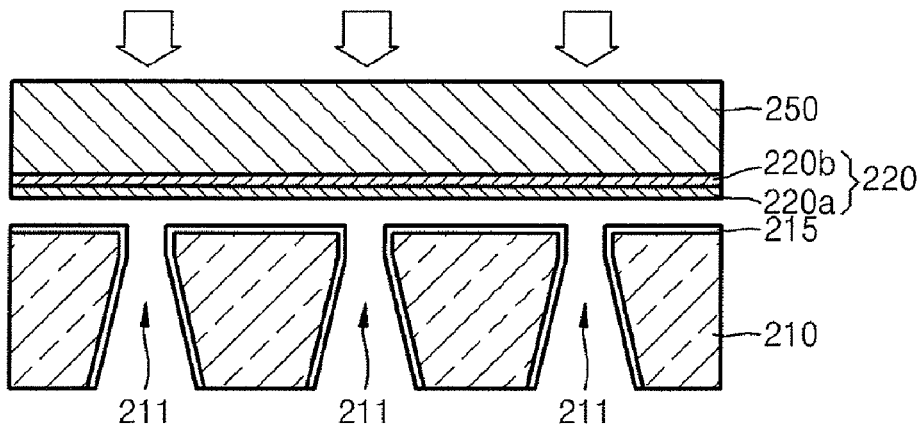

Referring to FIG. 9, a substrate 210 with an ink-philic coating film 215 formed thereon is prepared. The substrate 210 may be a silicon substrate. Nozzles 211 for ejecting ink are formed in the substrate 210. The ink-philic coating film 215 is formed on surfaces of the substrate 210, in detail, inner walls of the nozzles 211 and an outer surface of the substrate 210. The ink-philic coating film 215 may be formed of, for example, oxidized silicon. The ink-philic coating film 215 may be formed by thermally oxidizing a surface of the substrate 210 formed of silicon.

Next, the block copolymer layer 220 formed on the stamp 250 is transferred onto an upper surface of the ink-philic coating film 215 formed on an outer surface of the substrate 210. In detail, the ink-philic polymer block 220a of the block copolymer layer 220 formed on the stamp 250 is placed on the upper surface of the ink-philic coating film 215, and then the stamp 250 is pressed to transfer the block copolymer layer 220 formed on the stamp 250 onto the upper surface of the ink-philic coating film 215 formed on the outer surface of the substrate 210. The transferred block copolymer layer 220 includes the ink-philic polymer block 220a formed on upper surface of the ink-philic coating film 215 and the ink-phobic polymer block 220b formed on upper surface of the ink-philic polymer block 220a. Here, the ink-philic polymer block 220a of the block copolymer layer 220 can be securely attached to the upper surface of the ink-philic coating film 215, because they have the same property.

Figure 10:
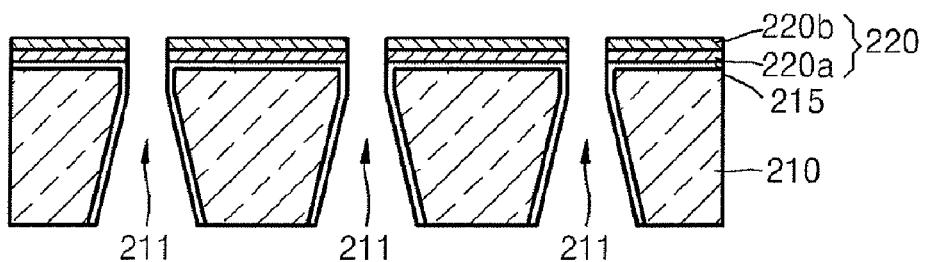

Finally, the stamp 250 is separated from the substrate 210 to form the nozzle plate as illustrated in FIG. 10. As such, since the ink-philic polymer block 220a of the block copolymer layer 220 is securely attached to the upper surface of the ink-philic coating film 215, and the ink-phobic polymer block 220b of the block copolymer layer 220 is exposed to the outside, an ink-phobic coating film is formed on a surface of the nozzle plate at the sides of outlets of the nozzles 211.

Figure 12:
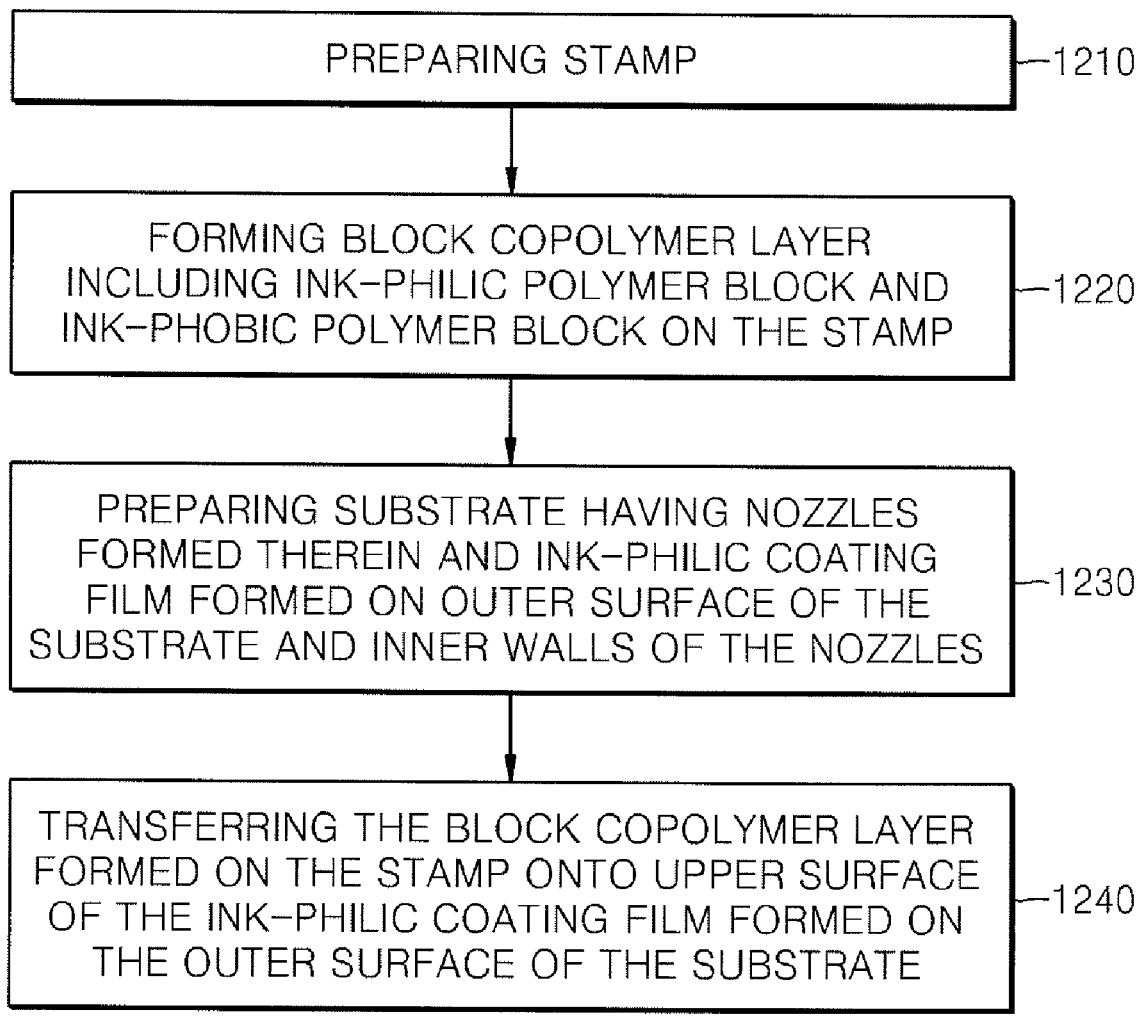
FIG. 12 is a flowchart illustrating a method of manufacturing a nozzle plate usable with an inkjet head according to an exemplary embodiment of the present general inventive concept.

FIG. 12 is a flowchart illustrating a method of manufacturing a nozzle plate usable with an inkjet head according to an exemplary embodiment of the present general inventive concept. Referring to FIG. 12, in operation 1210, a stamp is prepared. In operation 1220, a block copolymer layer including an ink-phobic polymer block and an ink-philic polymer block is formed on the stamp. In operation 1230, a substrate having nozzles formed therein and an ink-philic coating film formed on an outer surface of the substrate and inner walls of the nozzles is prepared. In operation 1240, the block copolymer layer formed on the stamp is transferred onto an upper surface of the ink-philic coating film formed on the outer surface of the substrate.

As described above, according to various embodiments of the present general inventive concept, a durable coating film can be selectively formed on a surface of a predetermined structure using a block copolymer. In detail, an ink-phobic coating film with improved durability can be formed on an upper surface of a black matrix or an outer surface of a nozzle plate at the side of outlets of nozzles using a block copolymer layer having a lamellar structure including an ink-philic polymer block and an ink-phobic polymer block.

Although various embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a nozzle plate usable with an inkjet head, the method comprising:
   preparing a stamp;
   forming a block copolymer layer including an ink-phobic polymer block and an ink-philic polymer block on the stamp;
   preparing a substrate having nozzles formed therein and an ink-philic coating film formed on an outer surface of the substrate and inner walls of the nozzles; and
   transferring the block copolymer layer formed on the stamp onto an upper surface of the ink-philic coating film formed on the outer surface of the substrate.

2. The method of claim 1, wherein the stamp comprises:
   an ink-phobic material.

3. The method of claim 2, wherein the stamp comprises:
   polydimethylsiloane (PDMS).

4. The method of claim 2, wherein the block copolymer layer is formed on the stamp by deep coating or spin coating.

5. The method of claim 2, wherein the block copolymer layer comprises:
   the ink-phobic polymer block formed on an upper surface of the stamp; and
   the ink-philic polymer block formed on an upper surface of the ink-phobic polymer block.

6. The method of claim 5, wherein the transferred block copolymer layer comprises:
   the ink-philic polymer block formed on an upper surface of the ink-philic coating film formed on the outer surface of the substrate; and
   the ink-phobic polymer block formed on an upper surface of the ink-philic polymer block.

7. The method of claim 6, wherein the transferring of the block copolymer layer comprises:
   placing the ink-philic polymer block of the block copolymer layer formed on the stamp on the upper surface of the ink-philic coating film; and
   pressing the stamp.

* * * * *